(12) United States Patent
Bartlett et al.

(10) Patent No.: US 6,319,793 B1
(45) Date of Patent: *Nov. 20, 2001

(54) CIRCUIT ISOLATION UTILIZING MEV IMPLANTATION

(75) Inventors: Donald M. Bartlett, Fort Collins; Gayle W. Miller; Randall J. Mason, both of Colorado Springs, all of CO (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,286

(22) Filed: Mar. 8, 1999

Related U.S. Application Data

(63) Continuation of application No. 08/720,595, filed on Sep. 30, 1996, now Pat. No. 5,880,515.

(51) Int. Cl.⁷ ................................................. H01L 21/76
(52) U.S. Cl. .......................... 438/418; 438/370; 257/547; 257/797; 257/798; 257/509
(58) Field of Search .................................. 438/418, 298, 438/370; 257/547, 797, 798, 509

(56) References Cited

U.S. PATENT DOCUMENTS

| | | | |
|---|---|---|---|
| 4,224,083 | 9/1980 | Cresswell | 148/1.5 |
| 4,847,672 | 7/1989 | Polhemus | 357/47 |
| 5,043,292 | 8/1991 | Aronowitz et al. | 437/26 |
| 5,116,777 | 5/1992 | Chan et al. | 437/56 |
| 5,118,636 | 6/1992 | Hosaka | 437/35 |
| 5,166,768 | 11/1992 | Ito | 257/523 |
| 5,184,203 | 2/1993 | Taguchi | 257/370 |
| 5,196,920 | 3/1993 | Kumamoto et al. | 357/84 |
| 5,268,312 | 12/1993 | Reuss et al. | 437/30 |
| 5,292,671 | 3/1994 | Odanaka | 437/29 |
| 5,317,183 | 5/1994 | Hoffman et al. | 257/369 |

(List continued on next page.)

FOREIGN PATENT DOCUMENTS

| | | | | |
|---|---|---|---|---|
| 3222467 | 1/1991 | (JP) | | H01L/27/04 |
| 5190777 | 7/1993 | (JP) | | H01L/27/06 |

OTHER PUBLICATIONS

Stanley Wolf Silicon Processing for the VSLI Era vol. 2 Lattice press pp. 387, 390, 1990.*

*Primary Examiner*—Charles Bowers
*Assistant Examiner*—David S Blum
(74) *Attorney, Agent, or Firm*—Cochran & Collins, L.L.P.

(57) ABSTRACT

A circuit isolation technique that uses implanted ions in embedded portions of a wafer substrate to lower the resistance of the substrate under circuits formed on the wafer or portions of circuits formed on the wafer to prevent the flow of injected currents across the substrate. The embedded ions provide low resistance regions that allow injected currents from a circuit to flow directly to a ground potential in the same circuit rather than flowing across the substrate to other circuits. High energy implantation processes on the order of 1 MeV to 3 MeVs can be used to implant the ions in embedded regions. Multiple energy levels can be used to provide thick embedded layers either prior to or after application of an epitaxial layer. Various masking materials can be used to mask the isolation regions during the implantation process, including hard masking materials such as silicon dioxide or silicon nitride, poly-silicon or an amorphous silicon layer, and a photoresist layer. Additive materials can be used in one or more of the masking layers to increase the absorption characteristics of the high energy ions. Separate physical masks can be used to block the implantation of ions.

21 Claims, 9 Drawing Sheets

U.S. PATENT DOCUMENTS

| | | | |
|---|---|---|---|
| 5,453,713 | 9/1995 | Partovi et al. | 327/565 |
| 5,459,349 | 10/1995 | Kobatake | 257/659 |
| 5,475,255 | 12/1995 | Joardar et al. | 257/547 |
| 5,501,993 | 3/1996 | Borland | 437/34 |
| 5,563,093 * | 10/1996 | Koda et al. | 438/418 |
| 5,623,159 | 4/1997 | Monk et al. | 257/509 |
| 5,767,561 | 6/1998 | Frei et al. | 257/499 |
| 5,793,093 | 8/1998 | Warwick | 257/510 |
| 5,880,515 | 3/1999 | Bartlett | 257/547 |

* cited by examiner

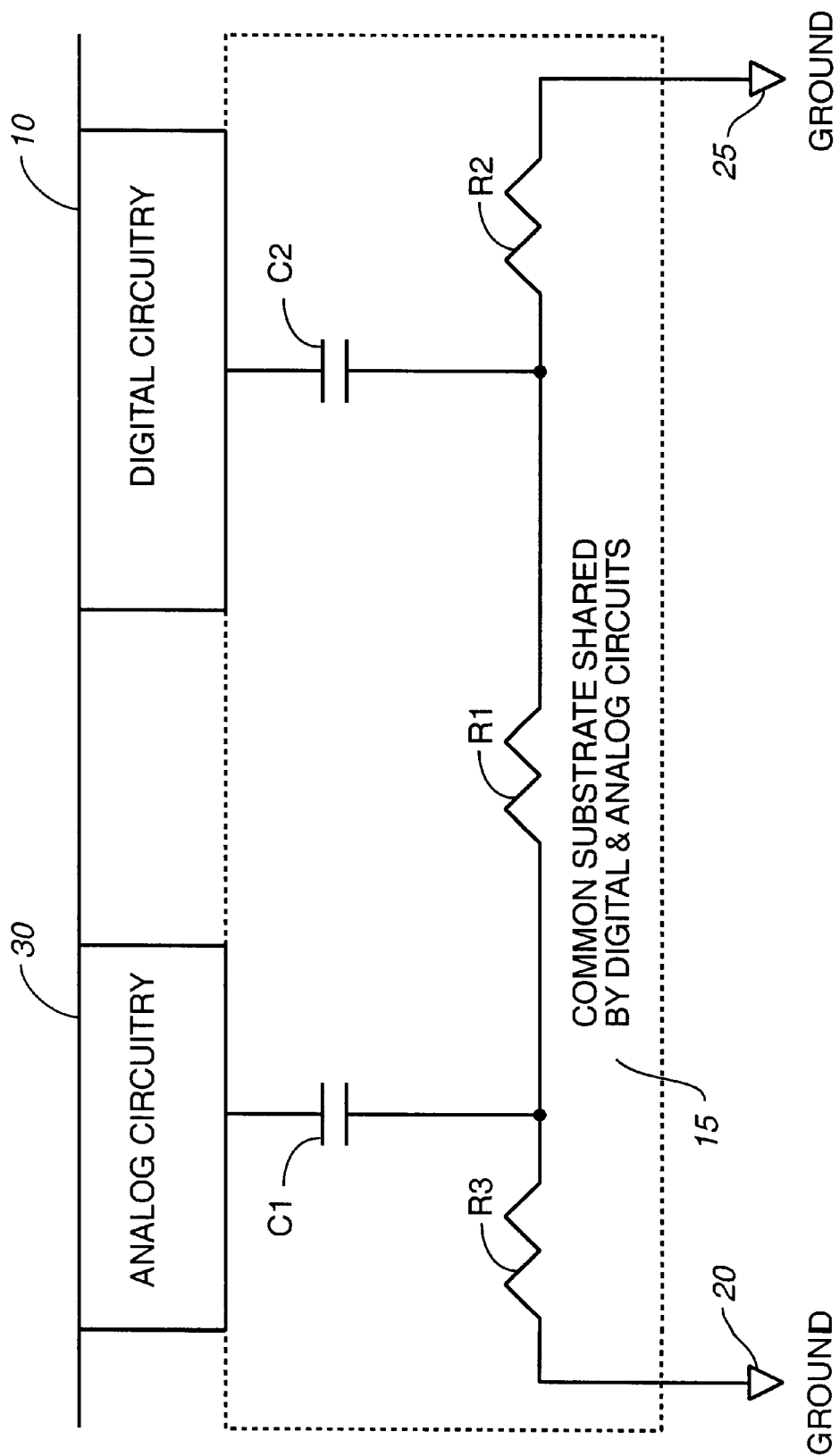
FIG._1

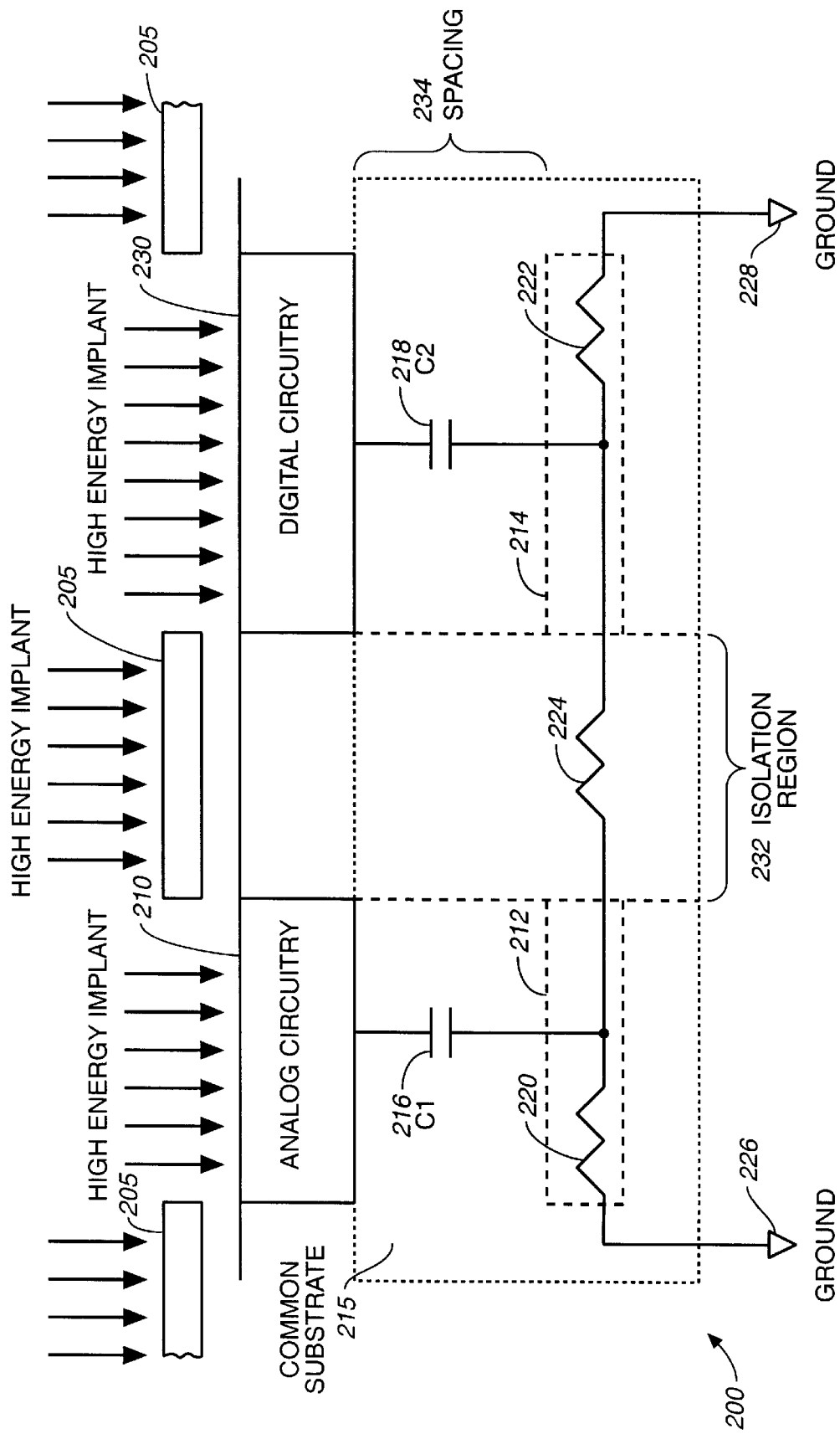
FIG._2

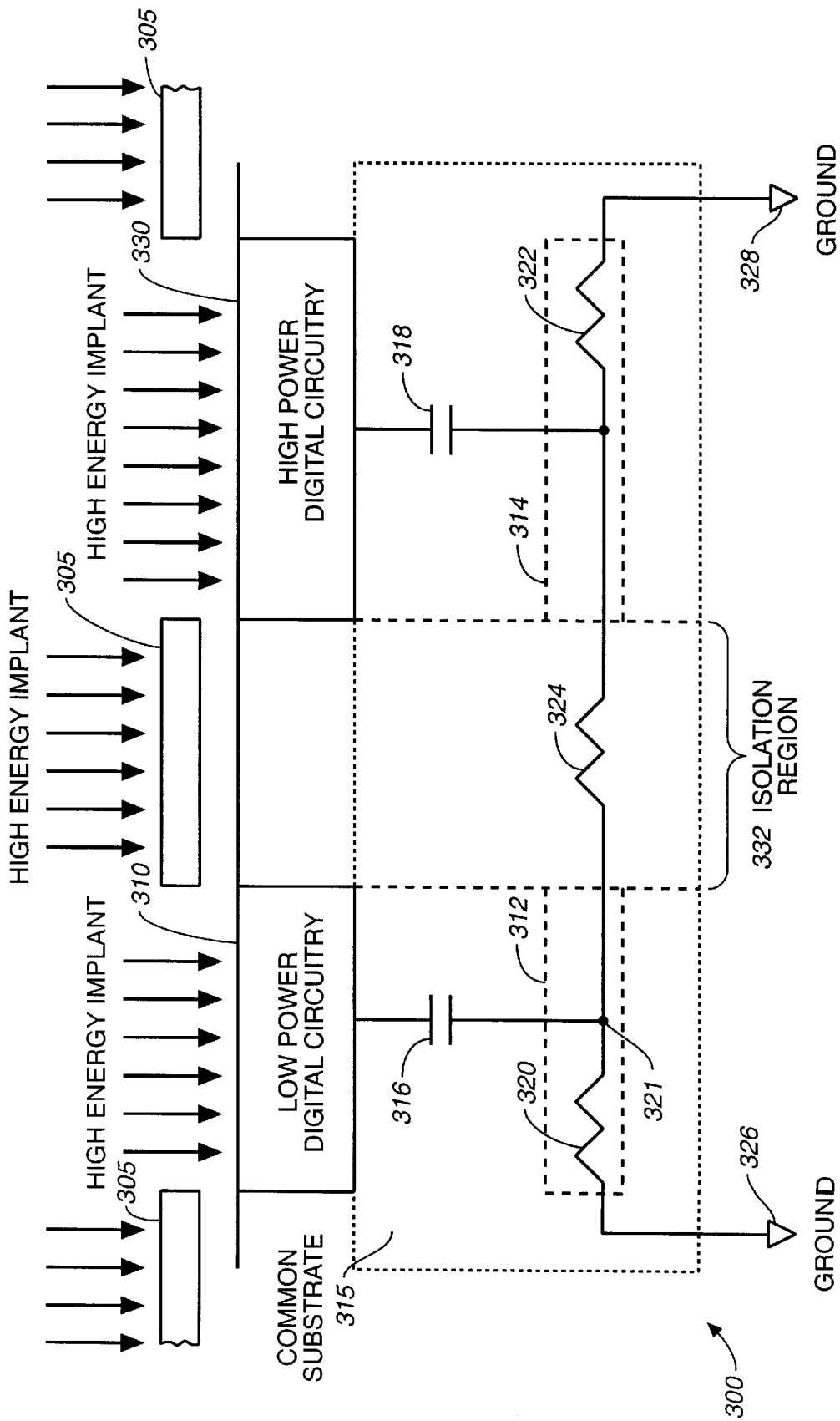
FIG._3

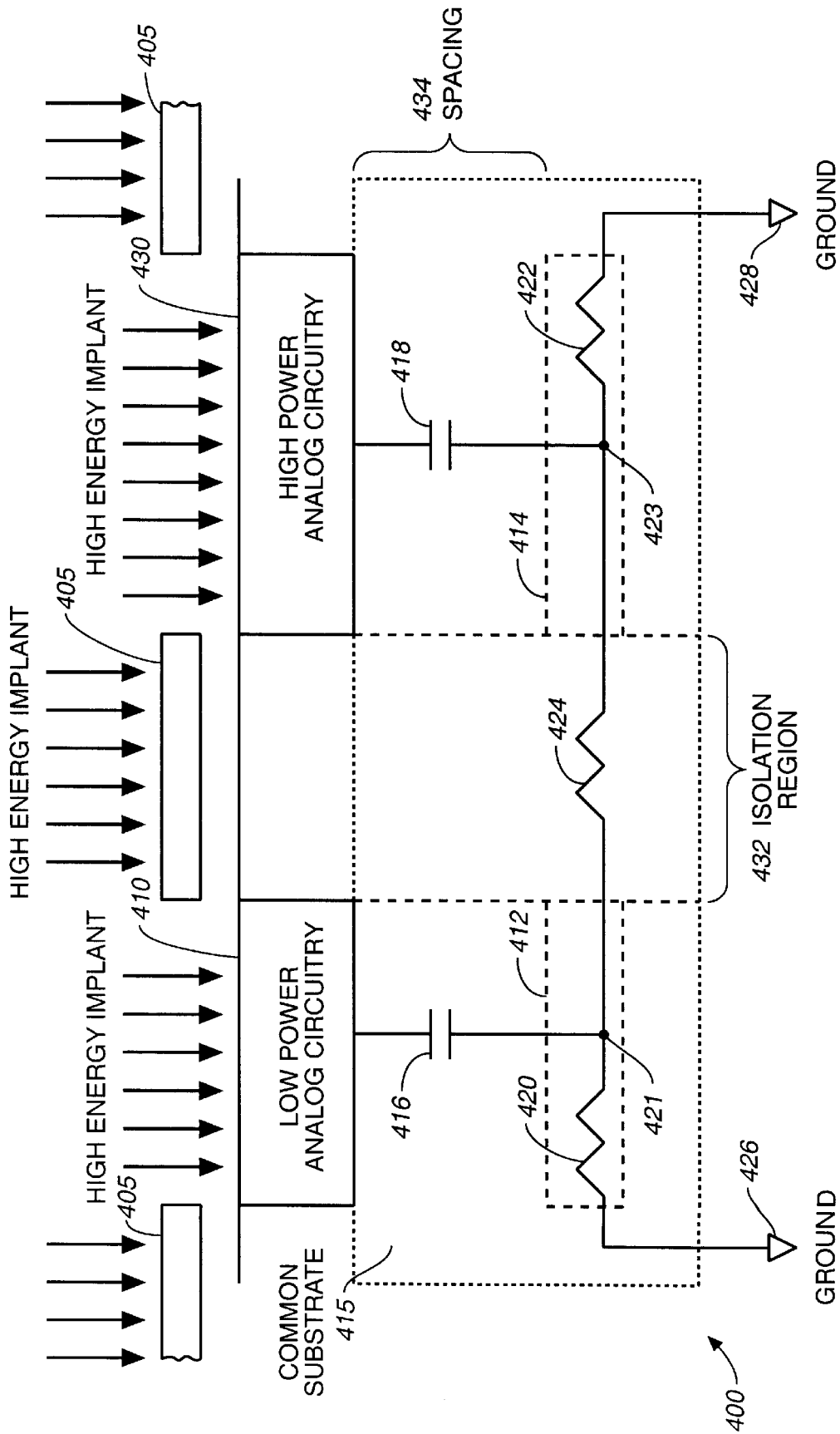
FIG._4

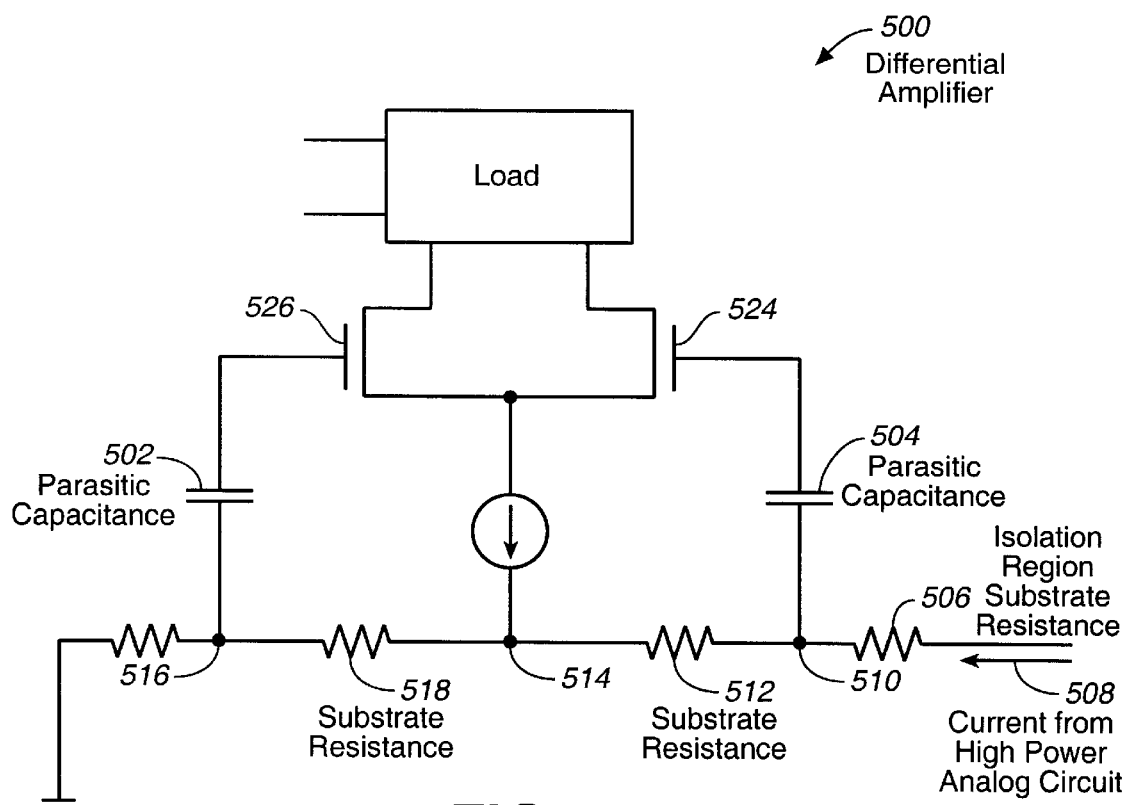
FIG._5

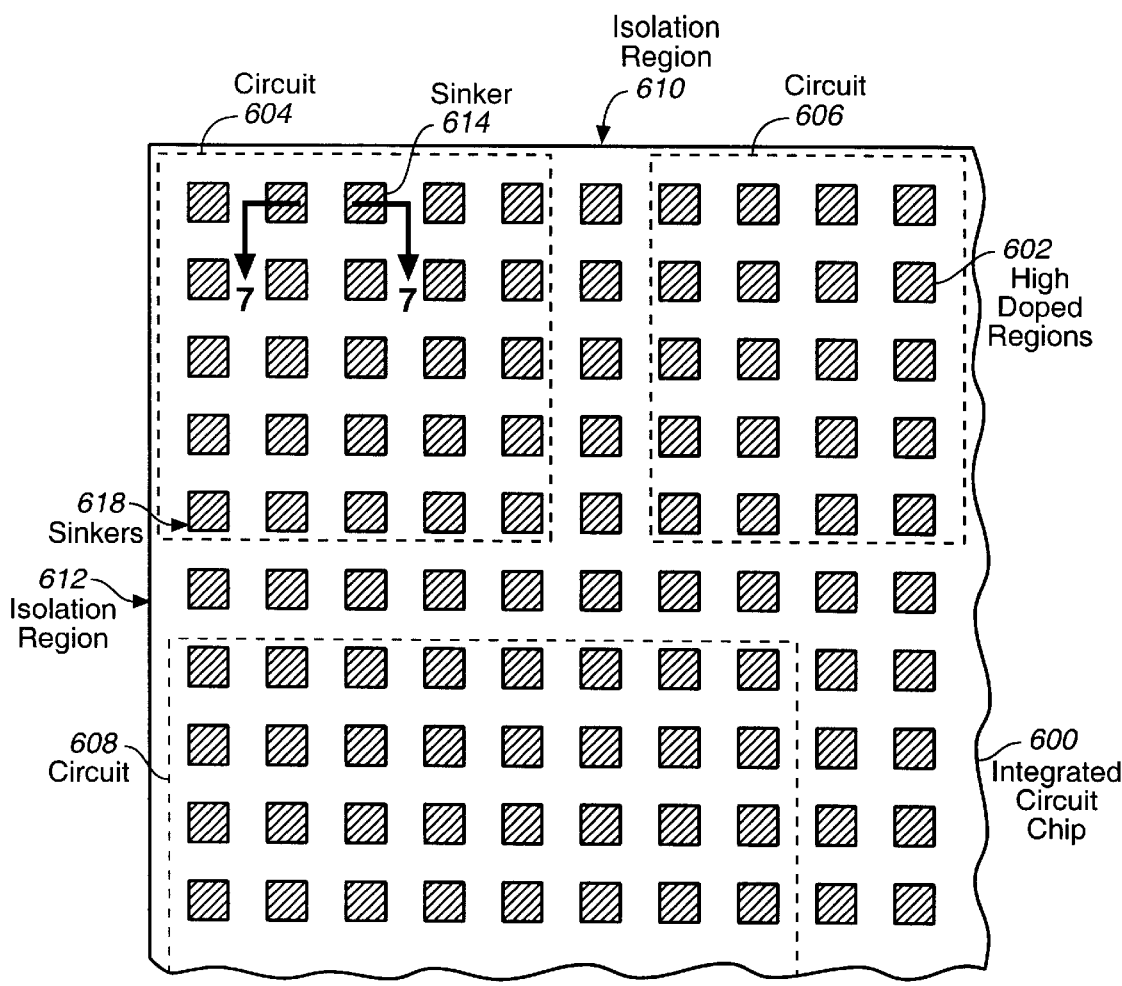
FIG._6
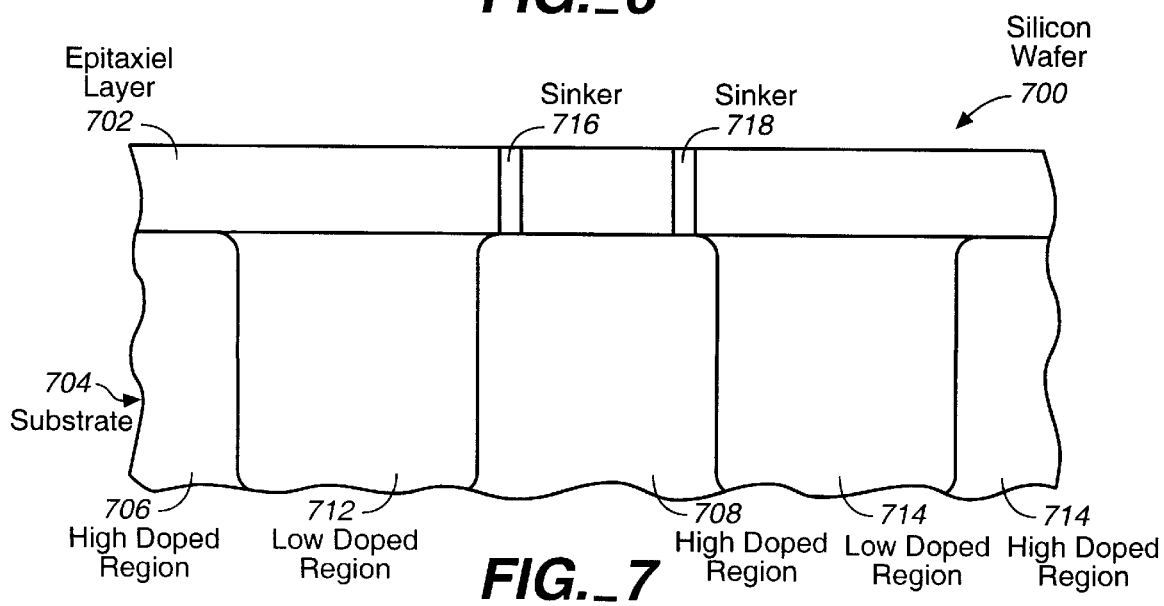
FIG._7

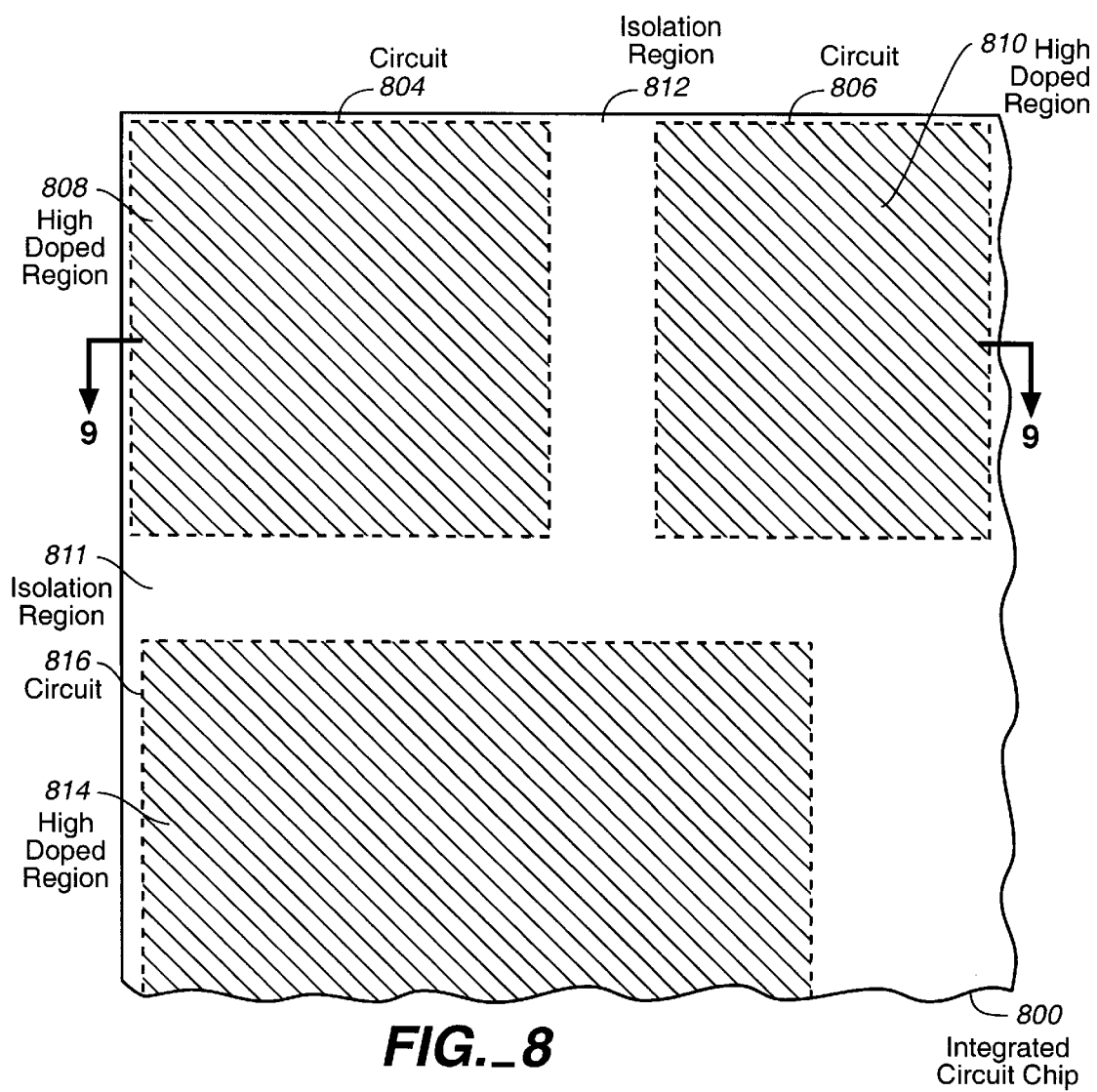
FIG._8
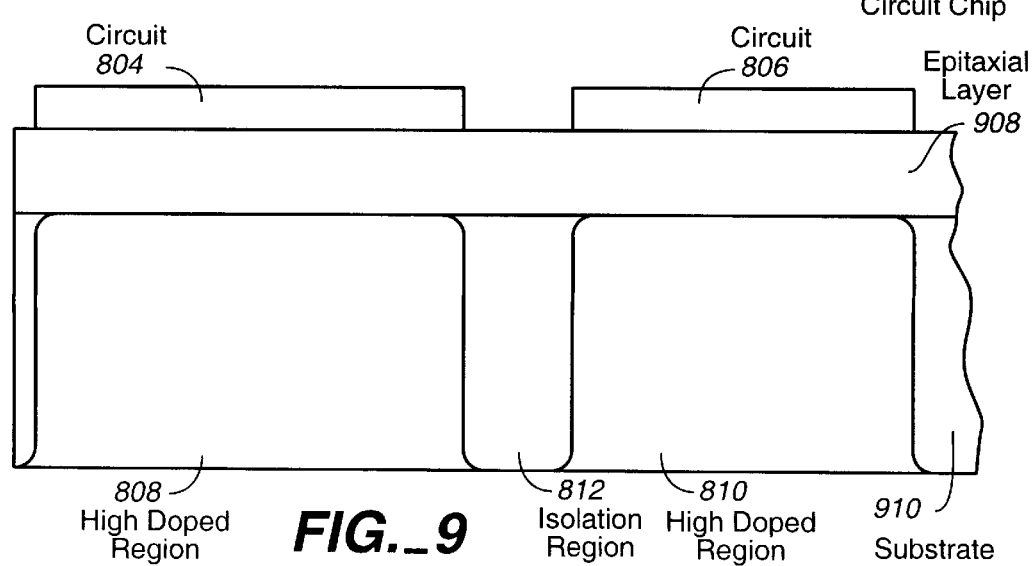
FIG._9

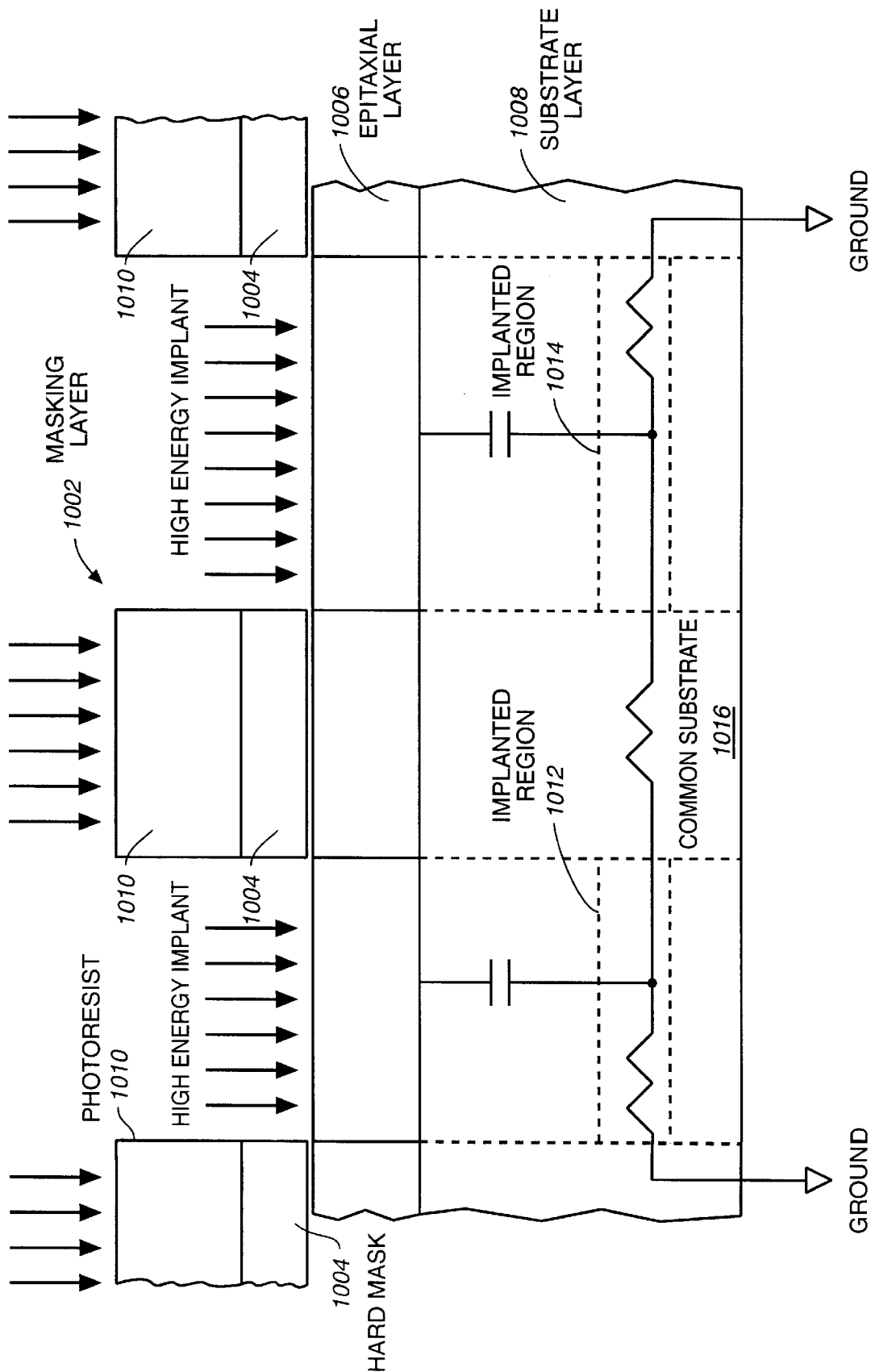
FIG._10

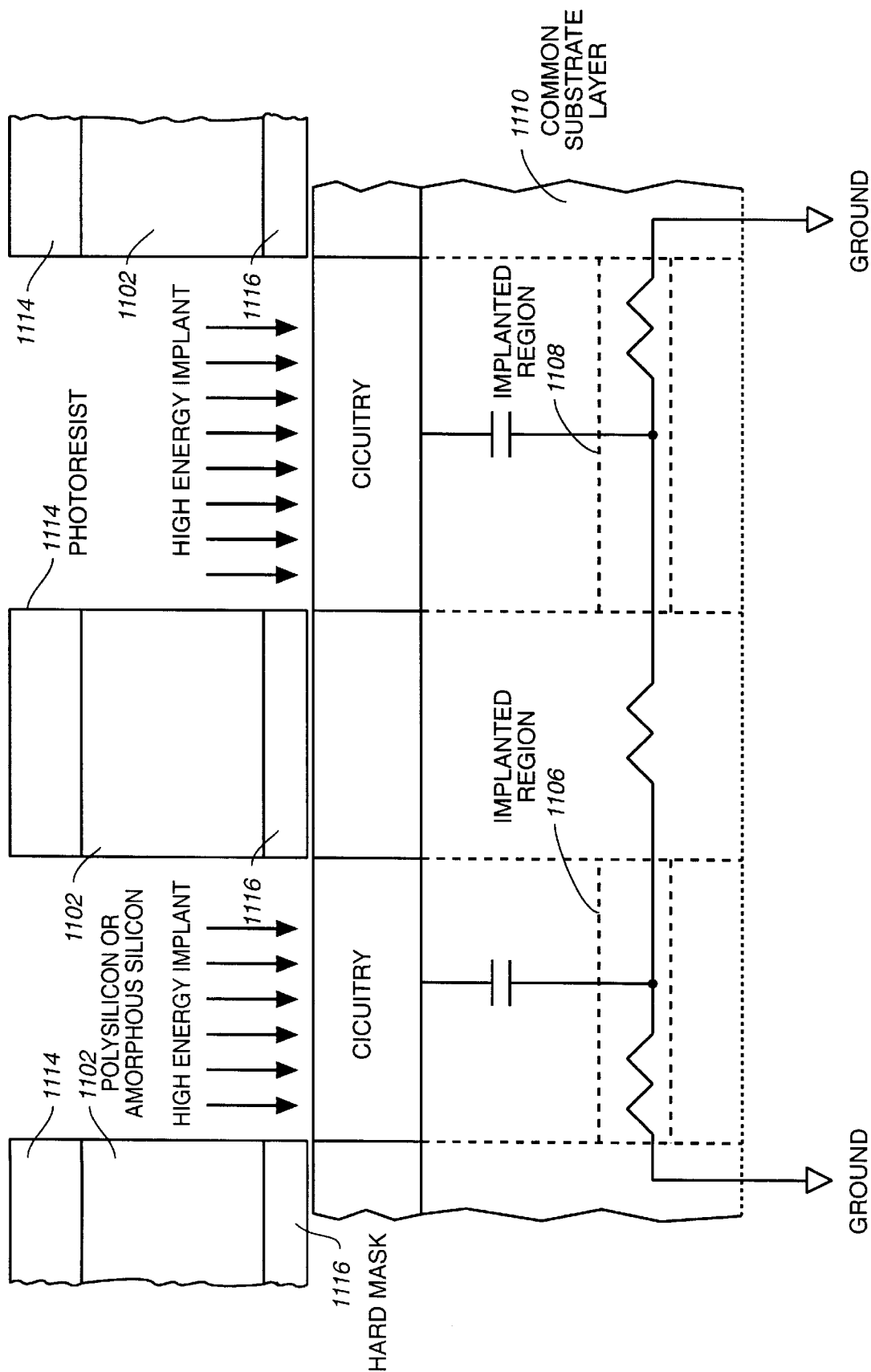
FIG._11

CIRCUIT ISOLATION UTILIZING MEV IMPLANTATION

This is a continuing application of U.S. Ser. No. 08/720,595, filed on Sep. 30, 1996, now U.S. Pat. No. 5,880,515.

FIELD OF THE INVENTION

The present invention relates to isolating circuits and more particularly to noise isolation between unrelated circuits on an integrated circuit.

BACKGROUND OF THE INVENTION

Noise isolation between unrelated circuits on an integrated circuit (IC) is highly desirable. This is particularly true when high power circuits and low power circuits are on the same IC. For example, low power circuits may process minimal signals (<10 mV) and cannot tolerate interference generated by high power circuits on the same IC. FIG. 1 illustrates one of the mechanisms in which coupling occurs between separate functions on the same IC. For example, when digital circuitry 10 switches between high and low states, the change in the inputs and outputs of digital circuitry 10 creates current impulses that are injected into the common substrate 15 via parasitic capacitance C2. C2 represents the total parasitic capacitance that exists between digital circuitry 10 and the common substrate 15. Transistors within digital circuitry 10 may be used to construct logic devices, such as inverters, NOR gates and AND gates that all contribute to the parasitic capacitance C2 that allows current to be injected into the common substrate 15 from digital circuitry 10. The current impulses from the digital circuitry 10, that are injected in the substrate 15, flow through substrate 15. Substrate 15 has a resistance that is represented by resistors R1, R2 and R3 between digital circuitry 10 and ground connections 20, 25 of the IC.

The current flow that is coupled through resistance R1 from digital circuitry 10 via parasitic capacitance C2 causes voltage noise that is coupled to analog circuitry 30 through parasitic capacitance C1. This noise coupling mechanism causes noise within analog circuitry 30 which limits the minimal signal voltages that can be processed by analog circuitry 30 when analog circuitry 30 is placed on the same IC (same substrate) as digital circuitry 10.

The distribution of the current flow, and hence the amount of coupled noise, is dependent on the values of resistances of R1, R2, and R3. If R1 is decreased relative to R2 and R3, more noise voltage is coupled to analog circuitry 30. When epitaxial wafers are used, the substrate normally has a lower resistance so that cross-talk problems are increased.

Currently, two basic substrate architectures exist for standard CMOS processing: bulk substrate wafers and epitaxial layered wafers. Bulk substrate wafers consist of silicon that is uniformly doped to a constant carrier concentration. Epitaxial layered wafers have a base of substrate layer that is a heavily doped layer and a lightly doped epitaxial layer. The light doping of the epitaxial layer emulates the surface background carrier concentration similar to that of the bulk substrate wafers. The heavily doped substrate layer provides a low impedance connection (R1), and thus more severe noise coupling occurs between analog circuitry 30 and digital circuitry 10.

Many alternatives exist to decrease the noise coupling through a common substrate. One alternative is to manufacture digital and analog circuits on separate ICs. This adds cost due to separate packaging and increased pin counts. Another alternative utilizes special processing steps, such as dielectric or junction isolation, that physically isolate unrelated circuits. However, these steps are costly compared to standard CMOS processes. Other alternatives rely on circuit design techniques, such as current-mode logic, or spacing of the unrelated circuits, but circuit noise isolation is still difficult to achieve using these alternatives.

It is against this background, and the limitations and problems associated therewith, that the present invention has been developed.

SUMMARY OF THE INVENTION

The present invention includes an integrated circuit that has a common substrate and at least two circuits, such as one or more low power circuits and one or more high power circuits. The substrate is preferably derived from a bulk substrate wafer. The integrated circuit preferably comprises at least two islands in the substrate layer that provide low resistance paths to the ground potential. These two islands are buried-layers that are implanted, by preference, using conventional high energy MeV implantation techniques.

The present invention also includes a method of manufacturing an integrated circuit including a substrate and at least two circuits. The method comprises the step of implanting at least two islands in the substrate for noise isolation between the circuits. The implanting can be accomplished using conventional masking and high-energy implantation, preferably MeV energy implantation.

The present invention may therefore comprise a method of isolating circuits to be formed on a common substrate of a wafer comprising the steps of masking predetermined locations on said wafer, irradiating the wafer with ions having an energy level sufficient to implant the ions in embedded regions of the common substrate so that portions of said embedded regions are substantially aligned with unmasked portions of the wafer so that isolation regions are formed between the embedded regions and the embedded regions are buried in the common substrate so that a portion of the common substrate separates the embedded regions from the circuits.

The present invention may also comprise a method of isolating circuits to be formed on a common substrate of a wafer comprising the steps of forming a mask in predetermined locations on the wafer that are substantially over the isolation regions between the circuits, irradiating the wafer with ions in the range of approximately 1 MeV–3 MeV to implant the ions in embedded regions of the common substrate so that the isolation regions are formed between the circuits and the embedded regions are buried in the common substrate substantially under said circuits.

The present invention may further comprise a method of isolating circuits to be formed on a common substrate of a wafer comprising the steps of forming a mask in predetermined locations on the wafer that are aligned with isolated regions between the circuits, irradiating the wafer with ions having an energy level sufficient to implant the ions in embedded regions of the common substrate that are substantially aligned with unmasked portions of the wafer so that the isolated regions are formed between the circuits and the embedded regions are buried in the common substrate and have a lower resistance than the common substrate so that currents injected into the common substrate by a particular circuit preferentially flow to a ground potential of the particular circuit rather than through the isolation region that has a higher resistance.

The present invention may further comprise an integrated circuit having a plurality of circuits formed on a common substrate that are isolated by isolation regions in the common substrate between the circuits, the integrated circuit made by the process of masking predetermined locations of the common substrate that are substantially aligned with the isolation regions with a material that is capable of masking high energy ions, irradiating the common substrate with the high energy ions such that the high energy ions have an energy level sufficient to implant the high energy ions in embedded regions of the common substrate that are aligned with unmasked portions of the common substrate, said unmasked portions being aligned with the circuits so that the isolation regions are formed between the embedded regions and the embedded regions are buried in the common substrate so that a portion of the common substrate separates the embedded regions from the circuits.

The present invention may further comprise an integrated circuit comprising a common substrate having low doping and a first predetermined resistance, circuitry formed on predetermined portions of the common substrate, embedded regions of the common substrate that are implanted with ions such that the embedded regions have a resistance that is lower than the first predetermined resistance, the embedded regions being substantially aligned with the circuitry and buried in the common substrate so that a portion of the common substrate separates the embedded regions from the circuitry The present invention may further comprise a silicon wafer suitable for the formation of integrated circuits comprising a common substrate on which the integrated circuits can be formed in predetermined locations on the common substrate, the common substrate having a first predetermined resistance, embedded regions of implanted ions deposited in the common substrate that are substantially aligned with the predetermined locations on the common substrate, the embedded regions having a resistance that is lower than the first predetermined resistance and buried in the common substrate so that a portion of the common substrate separates the embedded regions from the predetermined locations on which the circuits can be formed.

Numerous other advantages and features of the present invention will become readily apparent from the following detailed description of the invention and the embodiments thereof, from the claims and from the accompanying drawings in which details of the invention are fully and completely disclosed as a part of this specification.

BRIEF DESCRIPTION OF THE DRAWINGS

FIG. 1 is a cross-sectional view of an integrated circuit having unrelated analog and digital circuitry that shows a noise coupling mechanism.

FIG. 2 is a cross-sectional view of an integrated circuit having unrelated analog and digital circuitry that are isolated by implanted islands according to one embodiment of the present invention.

FIG. 3 is a cross-sectional view of an integrated circuit having a low power digital circuit and a high power digital circuit on a common substrate that are isolated in accordance with one embodiment of the present invention.

FIG. 4 is a cross-sectional view of an integrated circuit having a low power analog circuit and a high power analog circuit on a common substrate that are isolated in accordance with one embodiment of the present invention.

FIG. 5 is a schematic diagram of a sensitive differential amplifier that may be affected by injected currents in a common substrate.

FIG. 6 is a plan view of an integrated circuit that is implanted in accordance with one embodiment of the invention.

FIG. 7 is a cross-sectional view of one implementation of the integrated circuit illustrated in FIG. 6.

FIG. 8 is a plan view of one embodiment of the present invention.

FIG. 9 is a cross-sectional view of one implementation of the embodiment illustrated in FIG. 8.

FIG. 10 is a cross-sectional view of a wafer that is implanted in accordance with one embodiment of the present invention.

FIG. 11 is a cross-sectional view of a wafer that is implanted in accordance with one embodiment of the present invention.

DETAILED DESCRIPTION OF THE PREFERRED EMBODIMENT

While this invention can be implemented in various embodiments, the drawings illustrate, and the specification describes, detailed specific embodiments that are provided for the purpose of understanding that the present disclosure is to be considered as an exemplification of the principles of the invention, but is not to be limited to the specific embodiments described.

FIG. 2 illustrates an integrated circuit 200 according to the present invention. Substrate 215 is preferably part of a bulk substrate wafer with a high resistivity or may comprise an epitaxial layer having an underlying layer. Prior to the formation of any circuits, a high energy implant mask 205 is disposed on the surface of substrate 215 so that unmasked portions are substantially aligned with the circuits 210, 230, as illustrated. High energy implant mask 205 may comprise a silicon dioxide film, silicon nitride film or, as disclosed in more detail in FIG. 10, a combination of a hard masking material and photoresist. In any event, mask 205 should have sufficient thickness to stop penetration of the high energy accelerated ions into substrate 215 when the ion implantation step is performed. Alternatively, a layer of any other composition that stops ion penetration may be used in conjunction with mask 205.

Next, a high energy implantation is performed, preferably using energies on the order of one to several million-electron-volt (MeV) to form islands 212 and 214. For example, a 5 $\mu$m deep boron implantation into a silicon substrate requires an acceleration energy of approximately 3 MeV. The boron ions are accelerated through the substrate 215 until these ions lose energy and become implanted in buried regions 212, 214 of substrate 215. Buried regions 212, 214 become low impedance regions because of the implanted boron ions. The buried regions 212, 214 are spaced from the circuitry 210, 230 by several microns of the common substrate 215. This spacing in the common substrate can be the upper portion of a bulk substrate, if a bulk substrate is used to form the integrated circuit 200, or may be the epitaxial layer, or the epitaxial layer and a portion of the underlying substrate for epitaxial wafers. This spacing allows for the proper formation of the circuit elements on a low doped region of common substrate 215 that has high resistivity. The several micron high resistivity spacing of the buried layers 212, 214 from the circuitry 210, 230 in the common substrate 215 isolates the circuit elements of circuits 210, 230 from the low resistivity buried layers 212, 214, respectively. Failure to provide a sufficient spacing of several microns (e.g., 3 microns) will adversely influence the properties of the circuit elements or cause them to be shorted out. The high energy implant has minimal effect on the values of the coupling parasitic capacitances 216 (C1) and 218 (C2). However, the implantation of boron ions in regions 212, 214 significantly reduces the values of resistances 220 and 222 in the implanted regions 212, 214 with respect to the value of resistance 224 in the isolation region 232.

Referring again to FIG. 2, the resistance of the substrate material in islands 212 and 214 is much less than the resistance of the substrate material between these islands in the isolation region 232. Therefore, a high impedance isolation region 232 is formed between islands 212 and 214 to effectively reduce the noise coupled between circuits 210 and 230. Current injected by either the analog circuitry 210 or the digital circuitry 230 is primarily coupled to ground 226 or ground 228 through the low impedance regions 212, 214, respectively. Although the ground potentials 226 and 228 are shown as being connected downwardly through the substrate, in actuality, they are coupled through the spacing 234 of the common substrate 215 to ground potentials in each of the circuits. For example, there are a number of ground buses that run through the analog circuitry 210 which are effectively coupled to the buried layer 212 by the resistivity of the spacing 234 in the common substrate 215. Similarly, the buried layer 214 is effectively coupled to the plurality of ground buses and digital circuitry 230 by the resistivity of the spacing 234 in the common substrate 215. In essence, each of the isolation regions provides a low resistivity path to couple the parasitic capacitance of the circuit elements of a particular circuit to the plurality of ground buses that are placed throughout that particular circuit. In this fashion, the coupling of currents injected into the substrate to ground buses of adjacent circuits is much more difficult. In that regard, the isolation region 232 has a width that is much greater than the several micron spacing 234 which causes the resistance 224 in the substrate between the circuits 210, 230 to be much greater than the effective resistance of coupling between a ground bus and a circuit element in any individual circuit because of the close proximity of the low resistance implantation layers 212, 214 to the circuits 210, 230, respectively.

One skilled in the art will readily recognize that tailoring the shape and size of the mask can lead to the optimization of the resistor divider ratio to cause the noise coupling to be effectively eliminated. Adjusting the concentration of islands 212 and 214 will also optimize the elimination of the noise coupling. Furthermore, the present invention will lead to the reduction in both the size of system solutions as well as the cost of such systems.

FIG. 3 is a schematic illustration of another embodiment of the present invention. The integrated circuit 300 of the present invention utilizes a common substrate 315 for the formation of circuits 310, 330. Again, prior to the formation of circuitry 310, 330, a mask 305 is formed on the upper surface of the wafer so that unmasked portions are substantially aligned with circuits 310, 330. The high energy implantation process can then be performed to implant the embedded ions. As disclosed above, the mask 305 can comprise a silicon dioxide film and/or photoresist layer or other suitable material that can be patterned and etched and should have a thickness sufficient to stop the penetration of high energy (MeV) ions. Of course, as indicated above, any type of masking material could be used in accordance with the present invention to stop the penetration of ions into the masked area. As also indicated above, the high energy implantation process is performed using energies on the order of several million electron volts.

In accordance with the embodiment illustrated in FIG. 3, a low power digital circuit 310 shares the common substrate 315 of integrated circuit 300 with a high power digital circuit 330. The lower power digital circuit may comprise, for example, a sensitive clock circuit (not shown) having a digital divider (not shown) that is susceptible to jitter. The high power digital circuit 310, on the other hand, may comprise an output driver for the integrated circuit 300. A typical digital divider circuit (not shown) utilizes a receiver (not shown) that is connected to the output of a driver with both circuits being connected to a common Vss (or ground). The receiver circuit typically switches from high to low at its output based upon a predetermined input threshold voltage in response to an input signal provided by the driver circuit. The threshold voltage is determined by the difference between the supply voltage Vdd and the ground potential Vss. When currents are injected into the substrate 315 by the high power digital circuit 330, these currents affect the Vss voltage potential in the substrate. Since the receiver circuit may be spaced some distance apart from the driver circuit, an additional amount of resistance exists in the substrate between the Vss connection of the driver and the Vss connection of the receiver. As a result, the Vss potential of the driver and Vss potential of the receiver are different if a high power digital circuit 330 injects current into the substrate that flows over to the substrate of the low power digital divider circuitry. This causes the threshold voltage for the receiver circuit to change slightly when an injection current is present. The receiver, consequently, switches from high to low at a different voltage level. If the driver circuitry is generating a typical ramp signal, this will cause the receiver circuit to switch at a slightly different time when the injection current is present. As a result, the receiver circuit is not consistently switching at the same time because of the changing threshold voltage level of the receiver circuit which causes jitter in the output.

If the resistance 324 in the isolation region 332 of FIG. 3 is high compared to the resistance in the doped regions 312 and 322, current injected by the high power digital circuitry 330 flows through the low resistance 322 to ground buses in high power digital circuitry 330, that is schematically represented by ground connection 328, rather than flowing through resistance 324 of the isolation region, causing a change in potential at node 321. Ground potentials 326 and 328 are typically tied to a common ground potential in the metalization layers of these circuits, but may be tied to different ground potentials in some applications. In some applications, it is common to provide different ground potentials to different circuits. For example, implementation of IEEE P1394 buses many times necessitates a separate ground potential for the circuits connected to each side of the bus. By isolating the ground potentials 326 and 328 for circuits 310 and 330, such circuits can be implemented on the common substrate 315.

FIG. 4 is a similar diagram that illustrates the application of the invention using a low power analog circuit 410 and a high power analog circuit 430. Again, prior to fabricating circuits 410 and 430, a high energy implantation process is used in conjunction with mask 405 to implant embedded low resistance implantation regions 412 and 414. In this fashion, the substrate resistance in isolation region 432 is much higher than the resistance 420 in embedded layer 412 and resistance 422 in embedded layer 414. Again, embedded layer 412 provides a low resistance path between the circuit elements of the low power analog circuitry and the plurality of ground buses in the low power analog circuitry 410 that is represented by resistance 420. Similarly, the embedded layer 414 provides a low resistance path (represented by resistance 422) between the circuit elements of high power analog circuitry 430 and the plurality of power buses disposed in the high power analog circuitry 430. Since the isolation region 432 is much greater than the spacing or separation 434 of each of these embedded regions from the circuitry, and since the resistivity of isolation region 432 is much greater than embedded regions 412 and 414, the resistance 424 is substantially greater than the total resistance that includes the resistance of the common substrate 415 between the circuitry and the embedded layer, which is only several microns, and the resistance of the embedded region. The size of the isolation region 432 may, in fact, be several orders of magnitude greater than the spacing 434. After the regions 412 and 414 on the common substrate 415 are implanted with the high energy ions, the circuitry 410 and 430 are fabricated on the common substrate 415 or an epitaxial layer deposited on the substrate.

FIG. 5 is a schematic illustration of a typical differential amplifier circuit 500 that may be used in a low power analog circuit, such as low power analog circuitry 410 (FIG. 4). As is illustrated in FIG. 5, the differential circuit 500 has a pair of transistors 524, 526 that are coupled through parasitic capacitances 502 and 504 to the ground potential. The differential amplifier constitutes a very sensitive amplifier, such as a read channel amplifier, for amplifying the very low-level signals that are read from a disk drive head. Although such signals have a very low signal to noise ratio, most of the noise is provided as common mode noise that is canceled by the differential amplifier 500. However, the parasitic capacitances 502 and 504 may cause the transistors 524, 526 of the differential amplifiers to operate differently so that the common mode noise of the signal is not canceled out. As shown in FIG. 5, current may be injected, as illustrated in FIG. 4 by a high power analog circuit into the substrate. Referring to FIG. 4, the common substrate 415 has a resistance 424 in the isolation region that is high compared to the resistance 422 between the parasitic capacitance 418 and ground potential 428. The isolation resistance 424 corresponds to the resistance 506, illustrated in FIG. 5, that is the substrate resistance in the isolation region. If the resistance 506 is not sufficiently high, current 508 from the high power analog circuitry may flow through the substrate adjacent to the differential amplifier 500. As shown in FIG. 5, the parasitic capacitance 504 is effectively coupled to ground at node 510, as schematically illustrated in FIG. 5. Between node 510 and 514, the substrate also has an effective resistance 512. Between node 514 and 516, the substrate has an additional resistance 518. In other words, because the transistors in the differential amplifier 500 are physically spaced apart due to the layout of these devices, the parasitic capacitances 502 and 504 have effective connections to the substrate at different locations which are separated by a certain amount of substrate resistance, which is schematically illustrated as substrate resistances 512 and 518.

As can be seen from FIG. 5, when the current 508 flows through the substrate, node 510 is affected differently than node 516. In other words, node 510 has the additional voltage that is generated by the IR drop through substrate resistance 512 and 518, which does not occur at node 516. The transistors of the differential amplifier 500 are laid out to match each other very carefully so that common mode noise is canceled by the differential amplifier 500. However, the additional voltage potential at node 510, whenever an injection current 508 exists in the substrate from high power analog circuitry 430 (FIG. 4), will cause transistor 524 to operate differently than transistor 526. Hence, common mode noise will not be canceled and the very sensitive differential amplifier 500 will not operate properly. The present invention isolates the differential amplifier circuit 500 to minimize the current 508 that can flow from the high power analog circuitry to the substrate region of the differential amplifier 500.

FIG. 6 is a schematic illustration of a plan view of a portion of an integrated circuit chip 600. The integrated circuit chip 600 is formed on a silicon wafer that has an upper epitaxial high resistance layer that is disposed on a silicon substrate that has low doping during formation. As shown, the substrate of the integrated circuit chip 600 has a checkerboard pattern of high doped regions 602. These high doped regions 602 are regions that are uniformly implanted, as illustrated in FIG. 6, during the process of preparing the wafer. As shown in FIG. 6, circuits 604, 606 and 608 are formed on the upper epitaxial layer of the wafer of integrated circuit chip 600. As shown in FIG. 6, each of the circuits 604, 606 and 608 cover various portions of the high doped regions 602 and are substantially aligned with these portions. The high doped regions 602 provides a low resistivity area in the substrate layer below the epitaxial layer. In this manner, low resistance regions can be provided in multiple places under each of the circuits 604, 606 and 608 to provide low resistance ground connections through the wafer substrate. Within each circuit, metalization layers can be used to connect the various high doped regions 602. For example, each of the high dope regions below circuit 604 can be connected by a metalization layer in the circuit 604 that is formed on the wafer. In this fashion, all of the circuitry within a single circuit 604 can have the benefit of the low resistance connection through the high doped regions 602 that fall under the circuit 604 in the substrate of the integrated circuit chip 600. By using this technique for each of the circuits on the integrated circuit chip 600, the various high doped regions 602 that are located under the circuits are effectively coupled together and provide a common connection to the ground potential of each circuit. In this manner, isolation regions such as isolation region 610 and isolation region 612 are formed between the various circuits 604, 606 and 608 on the integrated circuit chip 600. Further, sinkers can be used to connect portions of the circuits through the epitaxial layers to the high doped regions to provide an even better connection to ground. Sinkers, such as sinker 614, can be located in various portions of the circuit that do not interfere with the circuitry that is formed on the upper epitaxial layer of the integrated circuit chip 600. A sinker may be placed on the integrated circuit chip prior to formation of the circuitry in positions over the high doped region that would connect a ground bus to the various high doped regions 602.

As also can be seen from FIG. 6, a series of sinkers 618 may be placed along a plurality of high doped region 602 that are in line with a ground bus in the metalization layer. In this manner, the sinkers can connect the ground bus to the high doped region 602 with very low resistance. The sinkers 618, as well as sinkers 614, may comprise CVD tungsten and suitable barrier and glue layers, as may be well appreciated by one skilled in the art. Heavily doped silicon can also be used as sinker material. The connection of the ground potentials in the metalization layer for each of the circuits 604, 606 and 608, illustrated in FIG. 6, allows the implementation of separate ground potentials, such as described with reference to FIG. 3 above.

FIG. 7 is a schematic illustration of a cross-section of a silicon wafer 700. The silicon wafer 700 includes a epitaxial layer 702 that has low doping and a high resistivity. Circuitry for an integrated circuit is formed on the upper surface of the epitaxial layer 702. The epitaxial layer 702 is deposited on a substrate 704 of the silicon wafer 700. The substrate 704 is formed such that it has a uniform low doping and high resistivity. In the manner illustrated in FIG. 6, a series of high doped regions 706, 708 and 710 can be formed in the substrate 704 through an implantation process. The implantation process occurs prior to the formation of the epitaxial layer 702 on the substrate 704, or may be performed after the epitaxial layer is placed on substrate 704. The disadvantage of implanting after the epitaxial layer 702 is placed on the substrate is that ions may be implanted in the epitaxial layer 702 which can adversely affect circuits that are grown in the epitaxial layer. Doping may occur with a series of implantation processes that implant ions at various depths in the substrate 704 using a series of different energies or a single implant using an ion beam having a range of energies. By using different energies, or a range of energies, ions can be deposited at different depths in the substrate 704. Masking, such as disclosed above, can be used to mask the regions 712, 714 in which low doping is desired. For example, low doping is desired in the isolation regions to increase the resistivity in the substrate 704 between adjacent circuits.

FIG. 7 also illustrates sinkers 716, 718 that provide a low resistance connection through the epitaxial layer 702 to high doped region 708. As disclosed above, sinkers 716, 718 may provide a connection from a metalization layer of an integrated circuit deposited on silicon wafer 700 to the high doped region 708.

FIGS. 8 and 9 illustrate an alternative embodiment in which the wafer is customized for a particular IC so that high doped regions are provided under the circuits that are formed on the silicon wafer. As shown in FIG. 8, circuits 804, 806 and 816 are formed on the silicon wafer of the integrated circuit chip 800. Prior to placing the circuits 804, 806 and 816 on the wafer, high doped regions 808, 810 and 814 are formed in the silicon wafer. The placement of the high doped regions 808, 810 and 814 is known for each chip and is located directly below each of the circuits 804, 806 and 816, respectively. By providing high doped regions under each of the circuits, isolation regions 811 and 812 are formed between the circuits.

The high doped regions 808, 810 and 814 of FIG. 8 may be formed in various ways. For example, the implanter may provide a narrowly focused beam and the wafer moved under the beam to implant the high doped regions 808, 810 and 814. This can be achieved using a stepper device which creates relative movement between the ion beam and the wafer. The beam can be focused so that the wafer can be moved to implant each of the high doped regions using several different steps, or the beam can be defocused to an extent that it would cover a large portion of the region of an average size circuit so that the wafer would only have to be stepped for each of the circuits that require a high doped region.

Further, a separate physical mask may be used to block the high energy ions from an ion beam that implants either an entire chip or an entire wafer at once. For example, a structural grid that matches the pattern of the isolation region 812 can be formed from metal or some other appropriate material capable of absorbing or otherwise blocking the ion beam. This separate physical mask is then either physically placed on, or directly above, the wafer in the proper location to block the high energy ions so that only the high doped regions 808, 810 and 814 are irradiated while the isolation regions 812 between circuits 804, 806 and 816 are shielded from the implanted ions. Alternatively, if a sufficiently laminar flow of ions can be generated by the implanter, a mask can be mounted on the implanter that would prevent the implantation of ions in the isolation region 812. By forming the high doped regions, such as high doped region 808 and 810, as shown in FIG. 9, prior to the deposition of the epitaxial layer 908, none of the epitaxial layer 908 is affected by the implantation of ions that could potentially contaminate the epitaxial layer 908. Of course, all of these processes can be used to implant ions after the epitaxial layer is placed on the substrate. Alternatively, the mask could be placed over the circuit regions and opposite type impurities implanted into the isolation regions to increase the resistance of these regions. For example, phosphorous ions could be implanted in the isolation regions of the p-type substrates. Similarly, boron ions could be implanted in n-type substrates.

As another alternative, the high energy implanter may also be able to provide a variable focus beam. In accordance with this embodiment of the invention, the substrate could be placed in a stepper and the wafer moved so that each of the high doped regions 808, 810, 816 that lie under circuits 804, 806 and 816, respectively, could be sequentially implanted with a beam that could be focused to generally cover the area under each of the circuits. An even further alternative to this embodiment would include a shutter device on the implanter, similar to the shutter devices used on x-ray machines, that could be adjusted to generate an ion beam having the general size and shape of the area under the circuit. In this manner, the shutter could be adjusted as the stepper moves the wafer for a sequential implantation by the high energy implanter.

Referring to FIG. 9, each of the circuits 804 and 806 are formed on the epitaxial layer 908. Circuit 804 is formed directly over the high doped region 808, while circuit 806 is formed over the high doped region 810. This provides an isolation region 812 between each of the high doped regions 808 and 810. In this manner, currents injected by either of the circuits 804 or 806 into the substrate 910 will be isolated by isolation region 812. Although not shown, sinkers could also be placed through the epitaxial layer 908 between circuits 804, 806 to high doped regions 808, 810 respectively, as illustrated in FIGS. 6 and 7.

FIG. 10 discloses an alternative method of forming a masking layer 1002. As disclosed in FIG. 10, a hard mask 1004 can be formed from silicon dioxide, silicon nitride or other common hard masking materials on the upper surface of the epitaxial layer 1006. In fact, one of the fabrication steps of the formation of the circuitry can be eliminated by growing the oxide layer on the epitaxial layer 1006 which also functions as the hard mask 1004. The hard mask 1004 is then coated with a layer of photoresist 1010. The photoresist is then exposed in the areas in which the circuitry is going to be fabricated, which is directly above the implantation regions 1012, 1014 in common substrate 1016, that is located in substrate layer 1008. The exposed photoresist is then removed and the hard mask is etched in those areas where the circuitry is to be formed. The isolation regions are then left with a layer of photoresist and a hard mask directly above these regions. The photoresist layer 1010 is left in place over the hard mask 1004 to provide an additional layer to absorb the high energy ions. The photoresist layer 1010 and the hard mask layer 1004 are designed to provide a cross-sectional thickness that is sufficient to absorb the high energy ions to prevent deposition in the regions of the epitaxial layer 1006 and substrate layer 1008 that are directly under the mask. Both the hard mask and the photoresist can include materials that will aid in blocking the high energy ions. For example, various materials can be included in the hard mask material to assist in blocking the high energy boron ions. Similarly, various materials can be included in the photoresist material for the same purpose. Although the embodiment of FIG. 10 illustrates the deposition of the hard mask layer 1004 on the epitaxial layer 1006, this process can also be performed directly on the substrate layer 1008 prior to deposition of the epitaxial layer 1006, or may be used on a bulk substrate wafer.

As indicated above, various materials can be used in place of the hard mask 1004. For example, a metalization layer can be applied over the entire surface of the wafer and the metal etched using a photoresist/etching process over the areas where the circuits are formed, such as illustrated in FIG. 8. Any desirable metal can be used in any desired thickness that is capable of blocking the high energy ions in the isolation regions between the circuits, such as isolation region 812 shown in FIG. 8. The only requirement of the metal or other material being used is that the material is capable of being deposited in sufficient thickness to have a cross-sectional absorption characteristic that will absorb the high energy ions and that the material is capable of being etched in some fashion. For example, various alloys can be used that have high absorption characteristics for high energy ions, such as iron or tungsten alloys. Such alloys can be easily etched using standard metal etching processes. As can be seen, a high degree of resolution in this process is not required as long as the isolation regions can be located proximately between the circuits. Since the high doped regions do not necessarily have to cover every portion of the circuit, a high degree of precision is not required. This process can also be performed either before or after the epitaxial layer is deposited on the substrate layer, or can be used in conjunction with a bulk substrate wafer. Again, the advantages of using this process prior to deposition of the epitaxial layer is that the risk of contaminating or otherwise damaging the epitaxial layer is eliminated. Of course, all of these different processes and alternatives can be used in conjunction with the embodiment illustrated in FIGS. 6 and 7.

FIG. 11 illustrates another embodiment of the present invention that uses poly-silicon or amorphous silicon as a masking material. Referring to FIG. 11, a hard masking material 1116 is initially placed on the upper surface of the wafer. Subsequently, a layer of poly-silicon or amorphous silicon 1102 is deposited over the hard mask layer 1116. The poly-silicon or amorphous silicon has a thickness that is sufficient to stop the implantation of high energy ions. Energies on the order of 1–3 MeV may be used to implant boron ions in implantation regions 1106 and 1108 that are buried in the common substrate 11 10. This will achieve implantation depths of approximately 3 to 5 microns in the substrate layer 1110 and provide a portion of the substrate 1110 and/or epitaxial layer that is several microns thick between the buried, implanted regions 1 106, 1108 and the circuits. This portion, as in the other embodiments disclosed, provides an insulating layer between the circuits and the implanted regions that is sufficiently thick to prevent the circuits from being adversely affected but narrow enough to provide local coupling of currents injected into the substrate back into the ground busses of the same circuit. Hence, if a poly-silicon or amorphous silicon layer 1102 has a depth of 5–6 microns, that thickness will be sufficient to absorb ions from the high energy implantation process. Next, a photoresist layer 1114 is placed over the poly-silicon or amorphous silicon layer 1102. The photoresist layer 1114 is exposed in a pattern that corresponds to the areas in which a high energy implant is desired and which is substantially aligned with the circuits. These areas may comprise specific portions of a circuit or the entire circuit. The photoresist 1114 is then removed in the exposed portions and the poly-silicon or amorphous silicon is etched in those portions down to the hard mask layer 1116. The hard mask layer 1116 is then separately etched in accordance with standard etching processes. The hard mask layer 1116 can comprise an oxide layer such as silicon dioxide, or silicon nitride or other suitable material. After the hard mask layer 1116 is etched, then the high energy implantation process can proceed to create implanted regions 1106 and 1108 on the common substrate 1112. The photoresist 1114, the poly-silicon or amorphous silicon layer 1102, and the hard mask layer 1116 are then removed so that the wafer can then be processed for the formation of circuits above the implanted regions 1106 and 1108. One advantage of the present invention is that if this process is used on a smaller scale so that individual elements of the circuitry are isolated to provide corresponding implant regions, it is possible to eliminate certain steps in the fabrication process. For example, hard mask 1116 can be a silicon dioxide layer that is grown and patterned so that individual elements such as transistors can be formed above the implanted region 1106. In this instance, the hard mask layer 1116 would not have to be removed and a separate step in the process could be eliminated. This process can also be performed on a bulk substrate wafer or prior to the deposition of the epitaxial layer 1104 over the substrate layer 1110.

Both the photoresist layer 1114 and the hard mask layer 1116 provide additional masking qualities for the implantation process. This helps to reduce the required thickness of the poly-silicon or amorphous silicon layer. The poly-silicon or amorphous silicon material comprises a material that is capable of being deposited in thicknesses in the range of 5–6 microns or more and which can be easily etched in a fashion that provides the required resolution for this process. It may also be desirable to add dopants to the poly-silicon or amorphous silicon that is deposited in layer 1102 which functions to further absorb the high energy ions. For example, dopants such as lithium, or other materials, can be dispersed within the amorphous silicon or poly-silicon layer to increase the effectiveness of the absorption characteristics of this layer. Dopants can also be included in the hard mask layer 1116 and the photoresist material 1114 to increase the masking characteristics of these materials.

The present invention therefore provides a unique way of diverting currents injected into a substrate from a high powered circuit to a ground potential to minimize the flow of these currents to other portions of a common substrate on which other circuits, such as low power circuits, exist. This is achieved by reducing the resistance of the substrate layer by implanting ions, such as boron ions, in an embedded, buried layer. Of course, any desirable ion that could be implanted to lower the resistance of the substrate can be used, as long as these ions do not cause excessive damage. Various masking materials can be used to isolate the implanted regions from the high resistance isolation regions in the substrate. Additionally, uniform patterns, such as a checkerboard pattern or a striped patterns, can be utilized to provide a wafer that is capable of being uniformly processed for any number of different circuits that can be formed on the wafer. Also, custom wafers can be used for specific circuits in which the location and size of the circuit are know. Any desired level of patterning can be used so that specific elements of specific circuits can be provided with high doped regions in the corresponding substrate. In this manner, sensitive circuits or sensitive elements in circuits can be isolated from each other, more high powered, portions of a circuit or other high powered circuits.

The present invention may be used in a number of different applications. Since it is desirable to provide a higher and higher degree of integration of various circuits, there are numerous applications of the present invention. For example, it would be advantageous to have a single disk controller circuit that would include both sensitive read channel circuits that are capable of reading the very low power signals that are detected from the magnetic head on the same integrated circuit chip with a high power analog servo circuit that is capable of driving the servo motors to move the head along the disk. Further, it would be desirable to provide various high and low power digital and analog circuits on a single chip for communication applications. For example, a high degree of integration is advantageous in cell phone circuitry where it would be advantageous to place sensitive circuits on a common substrate with high power circuits. It would also be desirable to place high I/O giga-hertz drivers on the same chip with more sensitive analog and digital circuitry. Further, it would be desirable to be able to place DRAM circuits on the same chip with sensitive circuitry. DRAM circuitry generates a high degree of noise in the substrate which can affect both sensitive analog and digital circuitry placed on a common substrate if the circuits are not isolated, such as disclosed in the present invention. Similarly, synchronous logic is commonly used in a number of circuits. Synchronous logic uses clock signals that generate clock pulses that occur at the same time. If a large number of logic circuits are utilized in a chip, a large current spike can be generated as a result of all of the logic circuitry firing simultaneously. This can cause large injection currents in the substrate. The present invention can isolate these large injection currents from sensitive circuits on the same chip. Hence, there are a large number of applications for the isolation techniques of the present invention to allow a high degree of integration on a single chip. In fact, the ultimate goal is to place an entire system on a chip that would provide the ultimate degree of integration available.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention, except insofar as limited by the prior art.

What is claimed is:

1. A method of isolating circuits to be formed on a common substrate of a wafer comprising the steps of:

masking locations on said wafer;

irradiating said wafer with ions having an energy level sufficient to implant said ions in embedded regions of said common substrate so that a portion of said embedded regions are substantially aligned with unmasked portions of said wafer and said embedded regions are buried in said common substrate that have a lower resistance than said common substrate and isolation regions having a higher resistance than said common substrate are formed between said embedded regions so that currents injected into said common substrate by said circuit preferentially flows to a ground potential rather than through said isolation region.

2. The method of claim 1 wherein said step of forming a mask further comprises the steps of:

depositing a layer of silicon on said wafer; and etching said silicon in said locations.

3. The method of claim 2 wherein said step of depositing a layer of silicon comprises the step of depositing a layer of amorphous silicon.

4. The method of claim 2 wherein said step of depositing a layer of silicon comprises the step of depositing a layer of poly-silicon.

5. The method of claim 1 wherein said step of forming a mask further comprises the steps of:

depositing a layer of hard masking material on said wafer;

depositing a layer of silicon or said layer of hard masking material;

etching said layer of silicon in said location;

etching said layer of hard masking material in said locations.

6. The method of claim 1 wherein said step of irradiating further comprises the step of:

irradiating said wafer with boron ions.

7. The method of claim 1 wherein said step of irradiating further comprises the step of:

irradiating said wafer with phosphorous ions.

8. The method of claim 1 wherein said step of irradiating further comprises the step of irradiating said wafer with ions so that said portion of said substrate that separates said embedded regions from said circuits comprises an epitaxial layer.

9. The method of claim 1 wherein said step of irradiating further comprises the step of irradiating said wafer with ions so that said portion of said substrate that separates said embedded regions from said circuits comprises an epitaxial layer and a portion of an underlying substrate layer.

10. The method of claim 1 wherein said step of masking further comprises the steps of:

placing a separate physical mask over said common substrate, said separate physical mask having a pattern of said masking material that corresponds to said isolated regions located between said circuits.

11. The method of claim 1 wherein said step of masking further comprises the steps of:

placing a separate physical mask at the output of an implanter such that said implanter only implants said common substrate in said implanted regions that are aligned with said circuits.

12. The method of claim 1 further comprising the steps of:

placing a shutter on the output of an implanter that can be adjusted to produce a beam that generally corresponds to the size of circuits on said wafer;

generating relative motion between said implanter and said common substrate to implant said common substrate in said implanted regions that are substantially aligned with said circuits.

13. A method of isolating circuits to be formed on a common substrate of a wafer comprising the steps of:

forming a mask in locations on said wafer;

irradiating said wafer with ions in the range of approximately 1 MeV to 3 MeV to implant said ions in embedded regions of said common substrate that have a lower resistance than said common substrate so that isolation regions that have a higher resistance than said common substrate are formed between said embedded regions so that currents injected into said common substrate by circuits substantially aligned with said embedded regions preferentially flow to a ground potential rather than through said isolation regions.

14. The method of claim 13 wherein said step of irradiating said wafer with ions comprises irradiating said wafer with boron ions.

15. The method of claim 14 wherein said step of irradiating said wafer with ions comprises irradiating said wafer with phosphorous ions.

16. The method of claim 14 wherein said step of forming a mask further comprises the steps of:

depositing a layer of silicon on said wafer; and etching said silicon in said locations.

17. The method of claim 14 wherein said step of depositing a layer of silicon comprises the step of depositing a layer of amorphous silicon.

18. The method of claim 14 wherein said step of depositing a layer of silicon comprises the step of depositing a layer of poly-silicon.

19. The method of claim 14 wherein said step of forming a mask further comprises the steps of:

depositing a layer of hard masking material on said wafer;

depositing a layer of silicon on said layer of hard masking material;

etching said layer of silicon in said locations;

etching said layer of hard masking material in said locations.

20. A method of isolating circuits to be formed on a common substrate of a wafer comprising the steps of:

forming a mask in locations on said wafer that are aligned with isolation regions in said common substrate between said circuits;

irradiating said wafer with ions having an energy level sufficient to implant said ions in embedded regions of said common substrate that are substantially aligned with unmasked portions of said wafer so that said isolation regions are formed between said circuits and said embedded regions are buried in said common substrate and have a lower resistance than said isolation regions so that currents injected into said common substrate by a particular circuit preferentially flow to a ground potential of said particular circuit rather than through said isolation region that has a higher resistance.

21. A method of producing an integrated circuit having a common substrate and isolation regions between circuits formed or said integrated circuit comprising the steps of:

masking regions of said common substrate that correspond to said isolation regions with a masking material that is capable of masking high energy ions;

irradiating said integrated circuit with said high energy ions to produce implanted regions of said ions in said common substrate that have low resistivity compared to said isolation regions in said common substrate that are masked to prevent deposition of ions so that current injected into said common substrate by said circuits preferentially flows to a ground potential rather than through said isolation regions;

forming said circuits on said integrated circuit so that said circuits are substantially aligned with said implanted regions and said isolated regions are located between said circuits that are not substantially aligned with said circuits.

* * * * *